United States Patent
Fiedler

(10) Patent No.: US 9,525,573 B2
(45) Date of Patent: Dec. 20, 2016

(54) SERIALIZING TRANSMITTER

(71) Applicant: Microsoft Technology Licensing, LLC, Redmond, WA (US)

(72) Inventor: Alan S. Fiedler, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/604,639

(22) Filed: Jan. 23, 2015

(65) Prior Publication Data
US 2016/0218896 A1    Jul. 28, 2016

(51) Int. Cl.
| | | |
|---|---|---|
| *H03K 19/173* | (2006.01) | |
| *H04L 25/49* | (2006.01) | |
| *H03K 19/00* | (2006.01) | |
| *H03K 19/0185* | (2006.01) | |

(52) U.S. Cl.
CPC ....... *H04L 25/4902* (2013.01); *H03K 19/0005* (2013.01); *H03K 19/018521* (2013.01); *H04L 25/4904* (2013.01)

(58) Field of Classification Search
CPC ............. H04L 25/4902; H04L 25/4904; H03K 19/1737; H03K 19/096; H03K 19/0005; H03K 19/018521
See application file for complete search history.

(56) References Cited

U.S. PATENT DOCUMENTS

| | | |
|---|---|---|
| 5,319,369 A | 6/1994 | Majos et al. |
| 5,689,731 A | 11/1997 | West et al. |
| 6,069,495 A | 5/2000 | Ciccone et al. |
| 6,665,360 B1 | 12/2003 | Duffy |
| 6,701,466 B1 | 3/2004 | Fiedler |
| 7,245,240 B1 | 7/2007 | Nguyen et al. |
| 7,307,558 B1 | 12/2007 | Karim et al. |
| 7,551,107 B2 | 6/2009 | Shim et al. |
| 7,609,799 B2 | 10/2009 | Li |
| 7,627,044 B2 | 12/2009 | Kim et al. |
| 8,415,980 B2 | 4/2013 | Fiedler |

(Continued)

OTHER PUBLICATIONS

U.S. Appl. No. 14/471,398, Fiedler, Alan, "A High-Performance, Low-Cost IO System", Filed Date: Aug. 28, 2014.

(Continued)

*Primary Examiner* — David B. Lugo
(74) *Attorney, Agent, or Firm* — Gregg Wisdom; Judy Yee; Micky Minhas

(57) ABSTRACT

In embodiments of a serializing transmitter, the serializing transmitter includes N multiplexing drive units, each configured to generate a series of output pulses derived from input data signals and multi-phase clock signals, and each multiplexing drive unit including a pulse-controlled push-pull output driver having first and second inputs and an output. Each multiplexing driver unit further includes a first M:1 pulse-generating multiplexer having an output coupled to the first input of the pulse-controlled push-pull output driver, and a second M:1 pulse-generating multiplexer having an output coupled to the second input of the pulse-controlled push-pull output driver, wherein each of the first and second M:1 pulse-generating multiplexers has three or fewer gate delays from a clock input to an output of the pulse-generating multiplexer.

20 Claims, 6 Drawing Sheets

(56) References Cited

U.S. PATENT DOCUMENTS

| | | |
|---|---|---|
| 8,514,108 B2 | 8/2013 | Chen et al. |
| 8,570,197 B2 | 10/2013 | Nguyen et al. |
| 8,832,487 B2 | 9/2014 | Fiedler |
| 8,836,384 B1 | 9/2014 | Oh et al. |
| 8,878,568 B1 | 11/2014 | Farzan et al. |
| 2007/0156932 A1 | 7/2007 | Kasahara et al. |
| 2010/0026214 A1 | 2/2010 | Nagamo |
| 2011/0291703 A1* | 12/2011 | Lee .................. H03M 9/00 326/93 |
| 2013/0002300 A1 | 1/2013 | Fiedler |
| 2013/0007500 A1 | 1/2013 | Fiedler |
| 2013/0278296 A1 | 10/2013 | Amirkhany et al. |
| 2014/0347092 A1 | 11/2014 | Amirkhany et al. |

OTHER PUBLICATIONS

U.S. Appl. No. 14/476,627, Fiedler, Alan, "Multi-Phase Clock Generator", Filed Date: Sep. 3, 2014.

Koyama, et al., "43 Gb/s Full-Rate-Clock 16:1 Multiplexer and 1:16 Demultiplexer with SFI-5 Interface in SiGe BiCMOS Technology", In IEEE International Solid-State Circuits Conference, Feb. 13, 2013, 10 pages.

Wong, et al., "A 2.5 Gbps CMOS Data Serializer", In IEEE Asia-Pacific Conference on ASIC, Aug. 8, 2002, 2 pages.

Boer, et al., "GaAs Mixed Signal Multi-Function X-Band Mmic with 7 Bit Phase and Amplitude Control and Integrated Serial to Parallel Converter", In Proceedings of 30th European Microwave Conference, Oct. 2000, 4 pages.

U.S. Appl. No. 13/170,585, Fiedler, Alan, "Serializing Transmitter", Filed Date: Jun. 28, 2011.

Kim, K et al., "A 3.4 Gbps Transmitter for Multi-Serial Data Communication using Pre-emphasis Method," Proceedings of the 4th WSEAS International Conference on Circuits, Systems, Signal and Telecommunications (CISST'10), Jan. 27, 2010, 4 pages.

ISA European Patent Office, International Search Report and Written Opinion Issued in Application No. PCT/US2016/012287, Apr. 4, 2016, WIPO, 12 pages.

ISA European Patent Office, International Search Report and Written Opinion Issued in Application No. PCT/US2016/012783, Apr. 20, 2016, WIPO, 14 Pages.

* cited by examiner

SERIALIZING TRANSMITTER

BACKGROUND

Conventional high-speed I/O data circuits to transfer large volumes of data at high speeds across short distances, such as from chip-to-chip on the same circuit board, are frequently inadequate for the task. The specifications for many industry standard I/O interfaces were outlined nearly a decade ago, and are general purpose designs that attempt to meet a wide range of design needs, but are not optimal for any one design.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

In embodiments of a serializing transmitter, the serializing transmitter includes one or more multiplexing drive units that each generate a series of output pulses derived from input data signals and multi-phase clock signals. Each of the multiplexing drive units includes a pulse-controlled push-pull output driver that has first and second inputs, and an output. Each of the multiplexing drive units also includes a first M:1 (where M is two or more) pulse-generating multiplexer having an output coupled to the first input of the pulse-controlled push-pull output driver, and generating a first series of intermediate pulses at the output; and a second M:1 pulse-generating multiplexer having an output coupled to the second input of the pulse-controlled push-pull output driver, and generating a second series of intermediate pulses at the output, wherein each of the first and second M:1 pulse-generating multiplexers has three or fewer gate delays from a clock input to an output of the pulse-generating multiplexer.

In other embodiments, serializing and transmitting serial data from parallel data includes coupling together outputs of at least two push-pull output drivers; controlling a source resistance of the two push-pull output drivers with a first feedback control loop; generating, using CMOS logic gates, a pull-up sequence of pulses and a pull-down sequence of pulses for each push-pull output driver to control the output driver, based on multi-phase clock signals and the parallel data.

BRIEF DESCRIPTION OF THE DRAWINGS

Embodiments of a serializing transmitter are described with reference to the following Figures. The same numbers may be used throughout to reference like features and components that are shown in the Figures.

DETAILED DESCRIPTION

Figure 1:
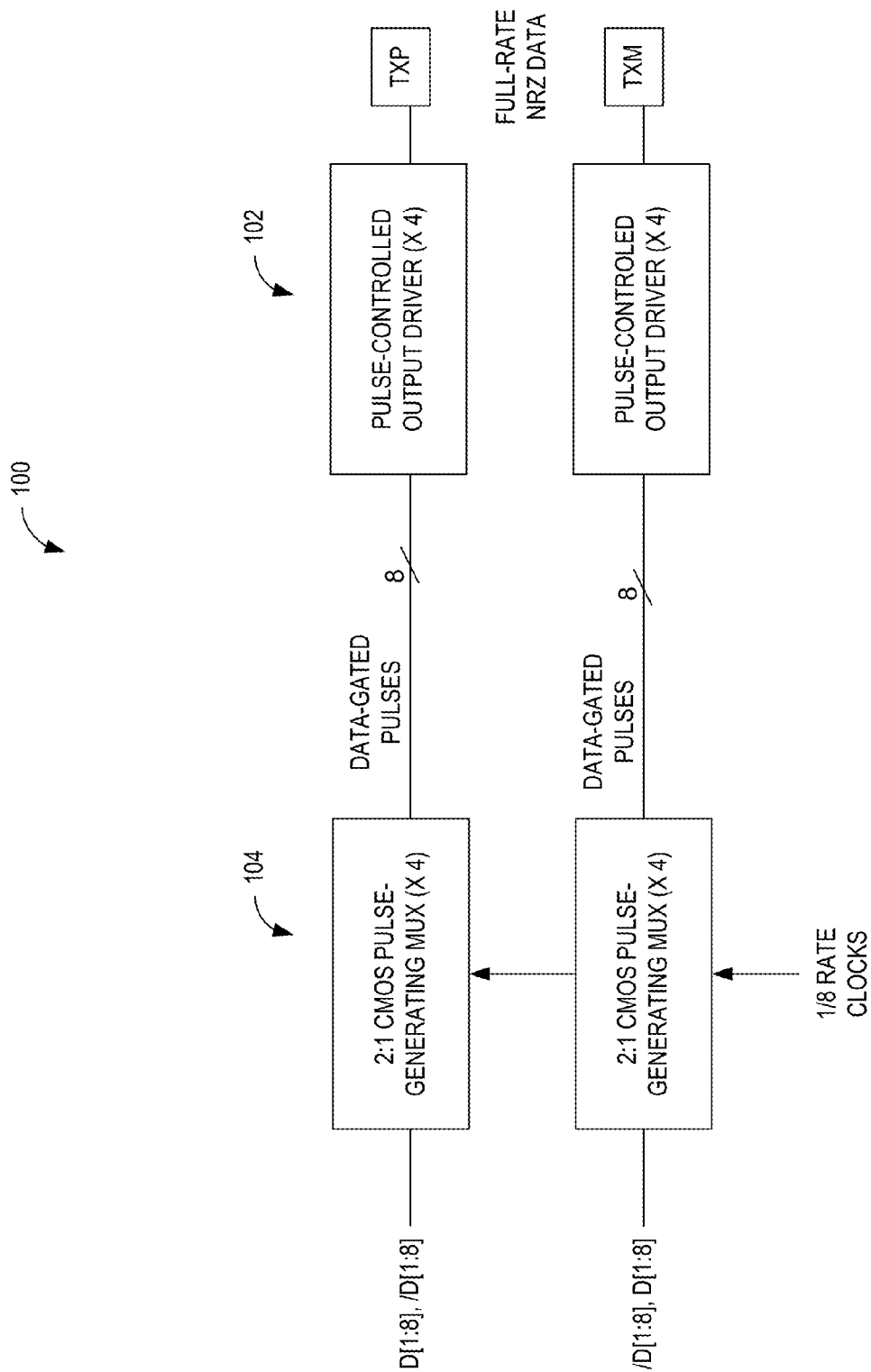
FIG. 1 illustrates an example of a high-speed differential serializing transmitter in accordance with one or more embodiments.

Some implementations of I/O data circuits that utilize packet-based communication can have a large memory requirement that may come with a significant latency penalty. Alternatively, attempts at full-custom I/O solutions are often less than optimal due to the improper application of digital design methods, induced power supply noise, and lack of signal integrity control. Chip designers are often faced with the dilemma of system implementation on a single, larger chip having a low yield and a high manufacturing cost with the benefit of faster intra-chip data communication, or system implementation with multiple chips having a higher yield and an overall lower manufacturing cost, but with slower inter-chip data communication.

One technique for high-speed data serialization and transmission could include a 2:1 multiplexer followed by an output buffer, and uses CMOS multiplexers to generate two ½-rate NRZ data streams that are directed to a 2:1 multiplexer controlled by a ½-rate clock. The 2:1 multiplexer then sends a full-rate NRZ data stream to an output driver that is implemented either as a CML parallel-terminated driver or as a push-pull series-terminated driver. Two factors limit both maximum bandwidth and achievable power efficiency. The first factor is the design of a 2:1 multiplexer with sufficient bandwidth to avoid inter-symbol interference (ISI) at the output, because any ISI-induced data-dependent jitter is further amplified by the output driver and channel due to finite bandwidth. This design limitation can be accounted for through appropriate sizing of the 2:1 multiplexer, but this in turn can lead to excessive power consumption. The second factor is that setup and hold time requirements for the 2:1 multiplexer is increasingly difficult to achieve reliably at very high data rates.

Embodiments of a serializing transmitter for chip-to-chip, chip-to-memory, and chip-to-optical-module NRZ (non-return-to-zero) data communication are described. The circuit topology of a serializing transmitter provides for low-power, high-speed operation and includes four pulse-toggled 2:1 CMOS multiplexers to form an 8:4 first stage of serialization, followed by a final pulse-controlled 4:1 serializer that is also a push-pull output driver, consuming one-quarter (¼) the power of a comparable parallel-terminated output driver. The first stage uses high-speed, rail-to-rail CMOS logic and consumes no static power, and its topology provides that the magnitude of its power supply current at each bit time is constant and independent of data. The push-pull output driver has a programmable source resistance, and when implemented differentially, consumes constant current when terminated at the receiver, again independent of data. Because of its constant current draw, the power supply bypass capacitance requirements of a serializing transmitter are minimized The integration of multi-chip systems, such as game consoles and other multi-processor computer systems, onto a single large chip can reduce costs by eliminating sometimes costly chip-to-chip data communication. However, if chip-to-chip data communication costs and other multi-chip costs can be reduced to less than the costs of integration (such as lower yield and higher cooling costs due to higher power density), a cost savings is obtained with a multi-chip solution. With a sufficiently low-cost, high-performance I/O, a multi-chip solution may be implemented rather than single-chip integration. Additionally, the performance of very large, frequently I/O-bound systems, such as Internet servers and supercomputers, can be improved with gains in I/O performance, be it an increase in data rate or a reduction in power.

In embodiments, a low-cost, area- and power-efficient CMOS serializing transmitter device addresses the need for both high speed and low power, and can be implemented for data communication between chips in the same package, on the same board, and on different boards across a backplane. The CMOS logic provides for superior speed-power ratio across a wide range of data rates, as well as portability across technology nodes, including future nodes that will provide further performance gains and power reduction. In spite of the use of CMOS logic, a serializing transmitter presents a largely constant current load to its power supply. Within the device, parallel signal paths generate multiple streams of data-controlled pulses to control a final 4:1 multiplexer that is also the output driver. The source termination resistance of a serializing transmitter is controlled over process, voltage, and temperature (PVT) to match the resistance of an external reference resistor.

While features and concepts of a serializing transmitter can be implemented in any number of different devices, systems, environments, and/or configurations, embodiments of a serializing transmitter are described in the context of the following example devices, systems, and methods.

FIG. 1 illustrates an example of a high-speed differential serializing transmitter 100. A series-terminated output driver 102 includes a 4:1 multiplexer function by the wire-OR'ing of the outputs of four pulse-controlled series-terminated output drivers. For low-power operation, the series-terminated output driver provides the same output signal amplitude at one-fourth (¼) of the power of a parallel-terminated output driver. Pulses can be utilized for multiplexer control, and the serializing transmitter 100 has a two-stage method of pulse generation. The serializing transmitter uses those pulses to control a push-pull series-terminated multiplexing output driver, rather than a CML multiplexer. Input signaling to the output driver includes ¼-rate data-gated CMOS pulses, rather than a full-rate NRZ data stream, so no individual pulse can interfere with any other pulse, and there is no contribution to inter-symbol interference in the final NRZ data stream. To generate data-controlled pulses for the each output driver, four 2:1 CMOS pulse-generating multiplexers 104 are controlled by eight ⅛-rate clocks and eight bits of data. The phases of the clocks are evenly distributed through 360 degrees. Although the serializing transmitter is described as a differential serializing transmitter, it can also be implemented as a single-ended serializing transmitter.

Figure 2:
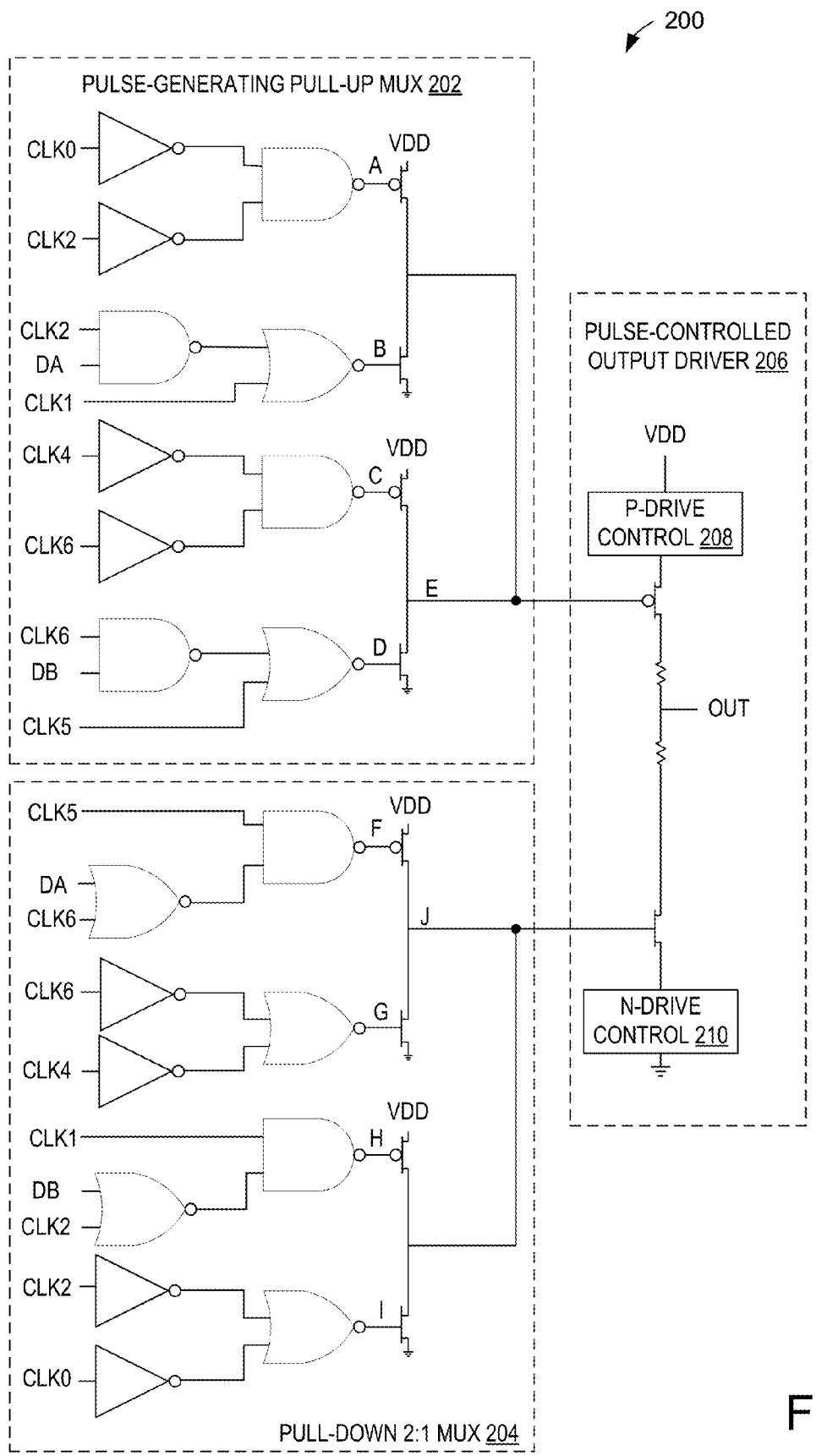
FIG. 2 illustrates an example of a multiplexing drive unit (MDU) in accordance with one or more embodiments.
Figure 3:
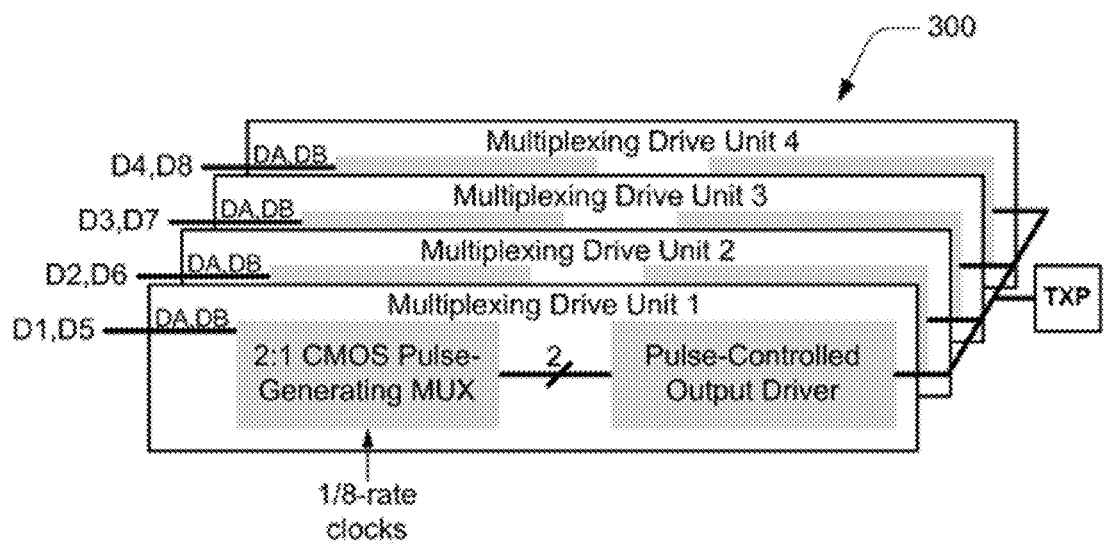
FIG. 3 illustrates an example of a serializing transmitter implemented with four MDUs in accordance with one or more embodiments.

FIG. 2 illustrates an example of a multiplexing drive unit (MDU) 200 that includes a pulse-generating pull-up multiplexer 202, a pull-down 2:1 multiplexer 204, and a pulse-controlled output driver 206. FIG. 3 illustrates an example 300 of connecting four MDUs to form an 8:1 single-ended serializing transmitter, where each MDU asserts onto the serializing transmitter output a high or low drive level for two of eight bit times and asserts no drive level for six bit times.

Within each MDU, two data-controlled pulse generators form a 2:1 multiplexer which generates pulses to control a pull-up transistor of the output driver. A second pair of data-controlled pulse generators generate controlling pulses for a second 2:1 multiplexer, which in turn generates pulses to control a pull-down transistor of the output driver. Within the data-controlled pulse generator, an assertion pulse generator (a NAND or NOR gate, depending on pulse polarity) generates a pulse that induces a transition at the 2:1 multiplexer output from a de-asserted state to an asserted state. A de-assertion pulse generator (a NOR or NAND gate) generates a pulse one bit time later to induce a transition at the 2:1 multiplexer output from its asserted state to its de-asserted state.

Small keeper transistors can be used to hold the 2:1 multiplexer output in its de-asserted state until the arrival of the next assertion pulse, which could occur as few as two bit-times later, or might never occur, as its arrival is dependent on the data pattern. In an alternative implementation, the de-assertion pulses are not gated by data, thereby ensuring that a de-assertion pulse always occurs and rendering the keeper transistors unnecessary. This alternative implementation consumes slightly more power. Bidirectional capability of the serializing transmitter is inherent in the construction of the MDUs, as their outputs can be tri-stated by de-asserting all data inputs.

As shown in FIG. 2, each of the pulse generating multiplexers have three or fewer gate delays from any clock input (CLK0-CLK2 and CLK4-CLK6) to the pulse generating multiplexer outputs (E and J of FIG. 2). First and second pulse generators of the pulse-generating pull-up multiplexer 202 each includes a first inverter coupled to a first clock input (CLK0/CLK4) and having a first inverter output, a second inverter coupled to a third clock input (CLK2/CLK6) and having a second inverter output, and a first NAND gate coupled both to the third clock input (CLK2/CLK6) and a data input (DA/DB) and having a first NAND gate output. Each of the above-described gates contributes to a first gate delay in the circuit. Each of the first and second pulse generators of pull-up multiplexer 202 also includes a second NAND gate coupled to both the first inverter output and the second inverter output and having a second NAND gate output, and a first NOR gate coupled to both the first NAND gate output and a second clock input (CLK1/CLK5) and having a first NOR gate output. The second NAND gate and the first NOR gate contribute to second gate delays for paths from the first and third clocks (CLK0/CLK4 and CLK2/CLK6), and to a first gate delay for the path from the second clock (CLK1/CLK5).

Each of the first and second pulse generators also includes a first p-type transistor having a drain, a gate, and a source, wherein the drain of the first p-type transistor is coupled to the pulse generator output and the first gate is coupled to the second NAND gate output, and a first n-type transistor having a drain, a gate, and a source, wherein the drain of the first n-type transistor is coupled to the pulse generator output and the gate is coupled to the first NOR gate output. The transistors contribute to the third gate delay for paths from the first and third clocks, and to a second gate delay for the path from the second clock. Each of the third and fourth pulse generators of the pulse-generating pull-down multiplexer 204 includes a second NOR gate coupled to both the data input (DA/DB) and the third clock input (CLK2/CLK6) and having a second NOR gate output, a third inverter coupled to the third clock input (CLK2/CLK6) and having a third inverter output, and a fourth inverter coupled to the first clock input (CLK0/CLK4) and having a fourth inverter output. Each of these gates contributes to a first gate delay in the circuit. Each of the third and fourth pulse generators of pull-down multiplexer 204 also includes a third NAND gate coupled to both the second clock input (CLK1/CLK5) and the second NOR gate output, and a third NOR gate coupled to both the third inverter output and the fourth inverter output. The third NAND gate and the third NOR gate contribute to second gate delays for paths from the first and third clocks (CLK0/CLK4 and CLK2/CLK6), and to a first gate delay for the path from the second clock (CLK1/CLK5).

Each of the third and fourth pulse generators also includes a second p-type transistor having a drain, a gate, and a source, wherein the drain of the second p-type transistor is coupled to the pulse generator output and the gate is coupled to the third NAND gate output, and a second n-type transistor having a drain, a gate, and a source, wherein the drain of the second n-type transistor is coupled to the pulse generator output and the gate is coupled to the third NOR gate output. The transistors contribute to the third gate delay for paths from the first and third clocks, and to a second gate delay for the path from the second clock. As described above, each of the first and second M:1 pulse-generating multiplexers 202 and 204 have 3 or fewer gate delays from a clock input to a transistor input and four or fewer gate delays from any of the clock inputs to the output of the multiplexing drive unit. By reducing the number of gate delays in the circuit respective to other multiplexer configurations, insertion delay, power and power-supply induced jitter in the circuit may be reduced.

In FIG. 2, the pulse-controlled output driver 206 of the MDU 200 includes a P-drive control 208 and an N-drive control 210. Using a feedback control loop to control the resistance of the P-drive control and the N-drive control, an MDU's drive resistance tracks an external reference resistor and is programmable.

Figure 4:
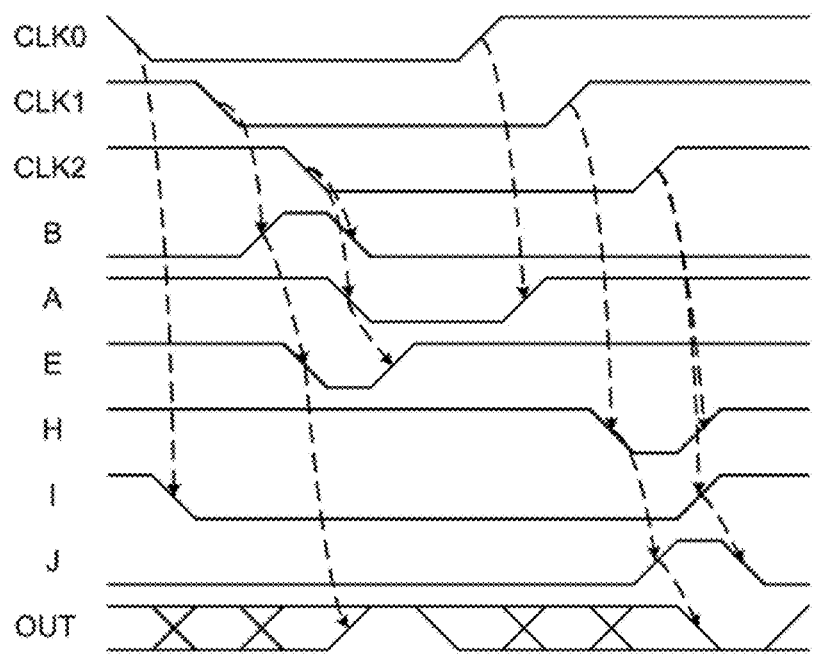
FIG. 4 illustrates an example of the functionality and timing of an MDU in accordance with one or more embodiments.

FIG. 4 illustrates an example 400 of the functionality and timing of a single MDU during eight bit-times when DA=1 and DB=0 (DA and DB are shown in FIG. 2). Here, the MDU asserts a high level at its output in one bit time, and asserts a low level at its output four bit times later. As shown, each of the clocks transition from high to low during successive bit times, and the MDU asserts a high level at its output in the bit time at which the third clock (CLK2) goes low. Likewise, the MDU asserts a low level at its output in the bit time at which the third clock (CLK2) goes high. During the other six bit-times, the MDU output is tri-stated.

Several aspects of the MDU contribute to its high-speed and low-power operation, and five aspects are described. In the first aspect, NRZ data is carried on just one net, OUT, and there is no longer the need for a 2:1 multiplexer to generate a full-rate, pre-driver NRZ data stream to drive an output driver. This provides for substantial power savings and an overall bandwidth improvement over previous implementations, as there is no pre-driver NRZ data stream that limits performance and may itself be in need of equalization. Apart from OUT, the highest-speed nets of the MDU do not carry NRZ data, but rather, single pulses one bit-time wide. Because these pulses occur no more frequently than every fourth bit-time on any given net, they have a full three bit-times to return to the de-asserted level, and do not contribute to ISI at OUT. Any ISI that may appear in the NRZ data stream at OUT is readily corrected by standard transmit de-emphasis and receive equalization circuits used to correct for channel-induced ISI.

Figure 5:
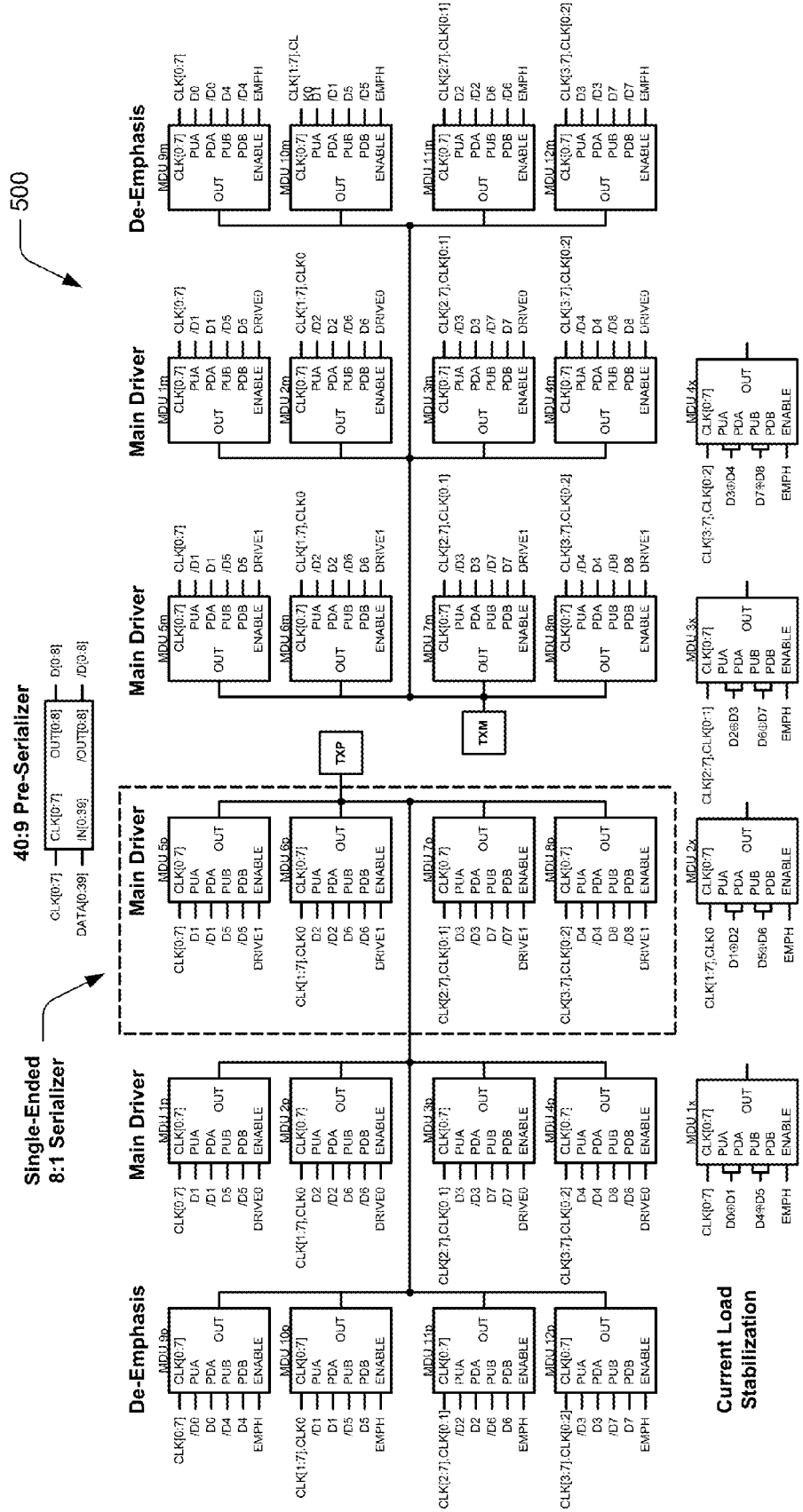
FIG. 5 illustrates an example of an 8:1 differential serializing transmitter with de-emphasis and power supply current load balancing in accordance with one or more embodiments.

In a second aspect, the MDU serializes two stages of pulse-toggled multiplexing, deriving substantial speed-power advantage from each stage. In a third aspect, an inherently low-power push-pull series terminated output driver is integrated with a high-performance pulse-toggled 4:1 multiplexer. This provides for both a reduction in power and an increase in speed, compared to conventional techniques where these functions are implemented separately. In a fourth aspect, the circuit topology contributes to high bandwidth on its highest-speed nets in two different ways. First, the gates that create and transfer these pulses all have very low fan-out (between ½ and 1) and very low fan-in (between 1 and 2). Second, the topology allows for the nets that carry these pulses (nets A-J in FIG. 2) to be physically very short. In a fifth aspect, by gating clocks CLK0-CLK2 and CLK4-CLK6 with the data signals DA and DB at the very root of the logic paths in the MDU, signal transitions and therefore power are minimized FIG. 5 illustrates an example 500 of connecting twenty four MDUs to form an 8:1 differential serializing transmitter with de-emphasis. MDU[1-8]p and MDU[1-8]m form a main tap of the differential serializing transmitter, and MDU [9-12]p and MDU[9-12]m provide de-emphasis to TXP and TXM during those bit times following no data transition. In contrast to a traditional current-steering output driver with de-emphasis, the application of de-emphasis in this serializing transmitter results in a small increase in power supply current load. MDU[1-4]x, small scaled replicas of the primary MDUs, balance this increase by presenting an extra current load to the power supply during those bit times immediately following any transition (i.e., when de-emphasis is not applied). This is achieved with the application of appropriate XOR of data to MDU[1-4]x. The magnitude of this extra power supply current load is programmable. A 40:9 pre serializer provides appropriately timed data and de-emphasis data for the MDUs.

To improve circuit performance, feedback control loops adjust transmit drive resistance and de-emphasis magnitude. Under digital control, each feedback control loop can be disabled or offset by a programmable amount.

Figure 6:
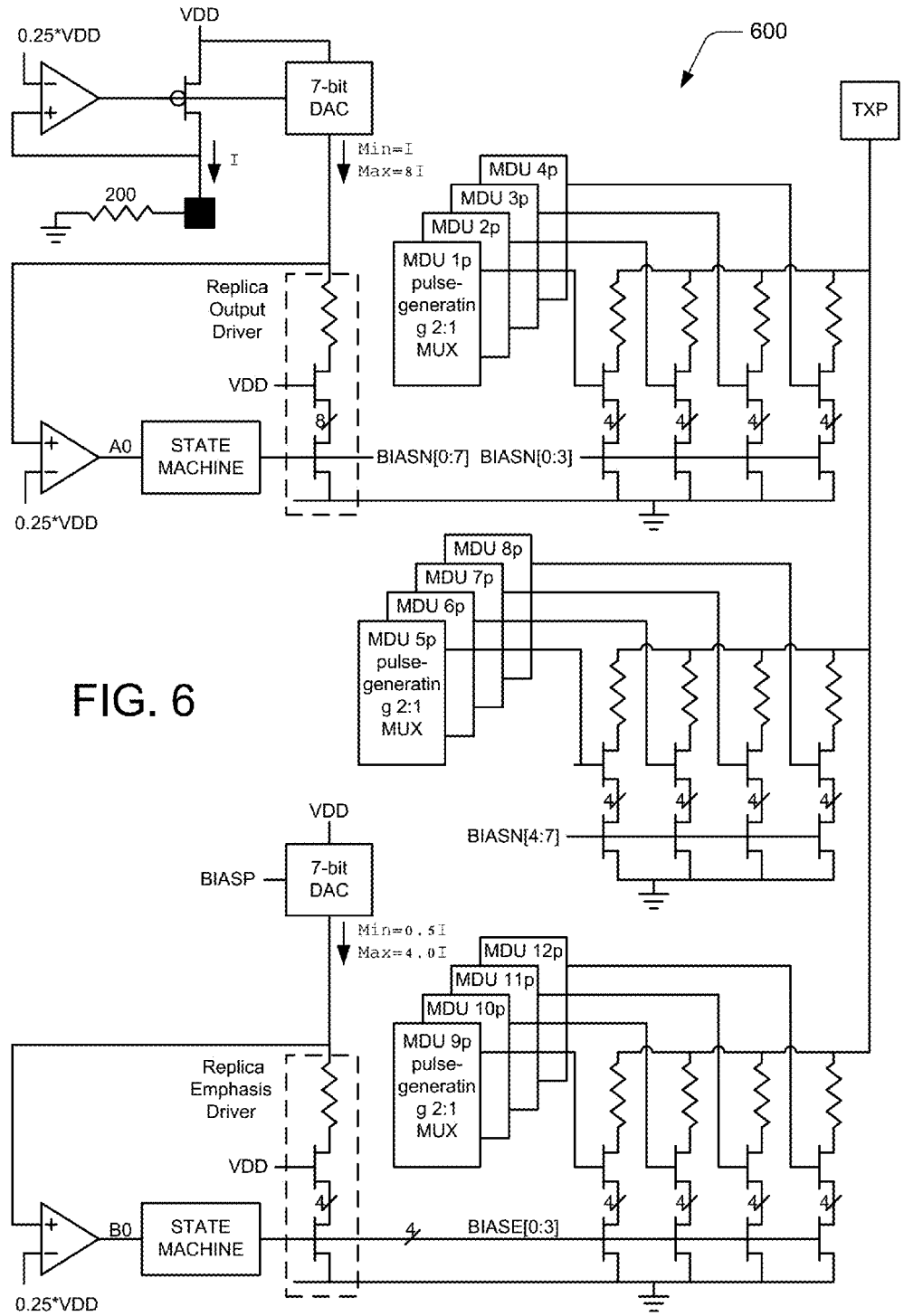
FIG. 6 illustrates a pull-down drive resistance and de-emphasis control circuit in accordance with one or more embodiments of a serializing transmitter.

FIG. 6 illustrates an example 600 of an MDU pull-down output transistor detail and the control of MDU drive resistance with selectable, equal-weighted output drive segments. A generated current is sourced to an off-chip reference resistor, and a scaled multiple of that current is also sent to an on-chip replica of the output driver. On startup, a state machine asserts control bits BIASN[0:7] to VDD in sequence, thereby turning on segments in the replica output driver one at a time until the voltage at the output of the replica output driver is less than the voltage at the reference resistor. At this time, no additional control bits are asserted, and an analog feedback control loop is then enabled by disconnecting the asserted bits of BIASN[0:7] from VDD and connecting them to net A0. The de-asserted bits of BIASN[0:7] remain held at 0V. The analog feedback control loop then adjusts the voltage of the asserted bits of BIASN [0:7] until the drive resistance of the replica pull-down output driver is the desired fraction of the external reference resistor, independent of PVT. A 7-bit DAC provides for adjustment of pull down drive resistance from 25 ohms to 200 ohms in 128 steps. Also shown is a replica emphasis pull-down driver and a second 7-bit DAC for the adjustment of emphasis driver pull down drive resistance from 50 ohms to 400 ohms in 128 steps. Similar circuits and methods control pull-up output transistor drive resistance.

Note the use of analog feedback control of the BIASN [0:7] and BIASE[0:3] voltages to provide a high resolution of drive resistance control. Because of this analog control, the resolution of drive resistance control is not constrained by the number of driver segments that are independently controlled, but rather 128 levels of termination resistance are achieved with just eight segments.

By lowering the cost of high-throughput, low-latency data interconnection, this serializing transmitter can lower costs by making the partitioning of a large system-on-a-chip onto multiple chips less costly than single-chip integration. It can also reduce the cost and improve the performance of any large system that requires substantial data communication to neighboring chips and memory, including supercomputers and Internet servers.

The described embodiments of a serializing transmitter can be implemented with various technologies other than CMOS technology. The voltage supply terminals can be relatively positive or relatively negative, depending upon the particular convention adopted and the technology used. The use of the terms "pull-up" and "pull-down" as described herein are arbitrary terms, and can refer to either a logic high-level or a logic low-level depending on the relative levels of the voltage supply terminals. Likewise, the term "coupled" can include various types of connections or couplings and can include a direct connection or a connection through one or more intermediate components.

Example method 700 is described with reference to FIG. 7 in accordance with one or more embodiments of a serializing transmitter. Generally, any of the services, functions, methods, procedures, components, and modules described herein can be implemented using software, firmware, hardware (e.g., fixed logic circuitry), manual processing, or any combination thereof. A software implementation represents program code that performs specified tasks when executed by a computer processor. The example methods may be described in the general context of computer-executable instructions, which can include software, applications, routines, programs, objects, components, data structures, procedures, modules, functions, and the like. The program code can be stored in one or more computer-readable storage media devices, both local and/or remote to a computer processor. The methods may also be practiced in a distributed computing environment by multiple computer devices. Further, the features described herein are platform-independent and can be implemented on a variety of computing platforms having a variety of processors.

Figure 7:
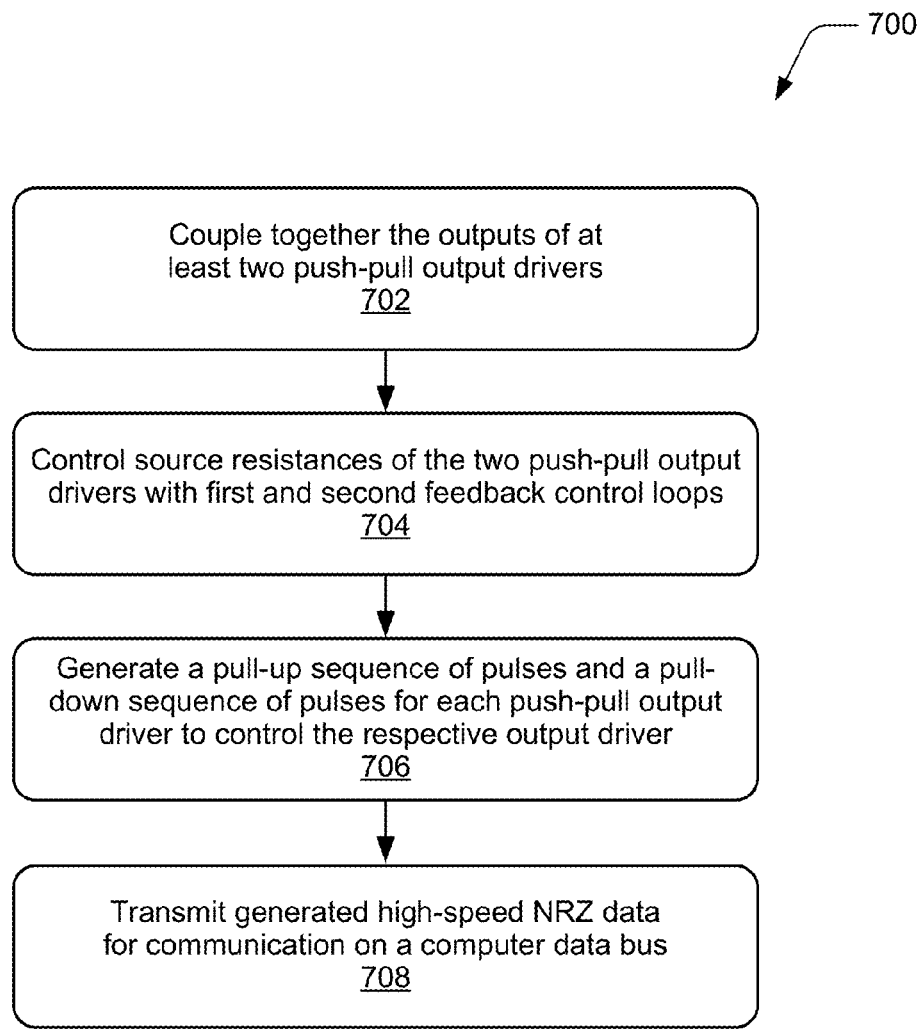
FIG. 7 illustrates example method(s) of a serializing transmitter in accordance with one or more embodiments.

FIG. 7 illustrates example method(s) 700 of a serializing transmitter to serialize and transmit serial data from parallel data. The order in Which the method blocks are described are not intended to be construed as a limitation, and any number of the described method blocks can be combined in any order to implement a method, or an alternate method.

At block 702, the outputs of at least two push-pull output drivers are coupled together. At block 704, source resistances of the two push-pull output drivers is controlled with first and second feedback control loops. For example, a pull-up source resistance and a pull-down source resistance are controlled. At block 706, a pull-up sequence of pulses and a pull-down sequence of pulses are generated for each push-pull output driver to control the respective output driver, based on multi-phase clock signals and the parallel data. At block 708, generated high-speed NRZ data is transmitted for communication on the computer data bus.

Another example provides a serializing transmitter, comprising N multiplexing drive units, each configured to generate a series of output pulses derived from input data signals and multi-phase clock signals, wherein N is a positive integer, and wherein each multiplexing drive unit includes a pulse-controlled push-pull output driver having first and second inputs and an output, a first M:1 pulse-generating multiplexer having an output coupled to the first input of the pulse-controlled push-pull output driver and configured to generate a first series of intermediate pulses having a first pulse width at said output, where M is two or more, and a second M:1 pulse-generating multiplexer having an output coupled to the second input of the pulse-controlled push-pull output driver and configured to generate a second series of intermediate pulses having a second pulse width at said output, wherein each of the first and second M:1 pulse-generating multiplexers has three or fewer gate delays from a clock input to an output of the pulse generating multiplexer. In such an example, the outputs of the multiplexing drive units may additionally or alternatively be coupled together. In such an example, M may additionally or alternatively equal 2, and the coupled outputs of the multiplexing drive units may additionally or alternatively be configured to output a serial data signal having a data rate. In such an example, the first 2:1 pulse-generating multiplexer may additionally or alternatively include first and second pulse generators, each having a data input, first, second, and third clock inputs, and an output, and the outputs of the first and second pulse generators may additionally or alternatively be coupled together. In such an example, the second 2:1 pulse-generating multiplexer may additionally or alternatively include third and fourth pulse generators, each having a data input, first, second, and third clock inputs, and an output, and the outputs of the third and fourth pulse generators may additionally or alternatively be coupled together. In such an example, the first and third pulse generators may additionally or alternatively be coupled to a first data signal input, and the second and fourth pulse generators may additionally or alternatively be coupled to a second data signal input. In such an example, each of the first and second pulse generators may additionally or alternatively comprise a first inverter coupled to the first clock input and having a first inverter output; a second inverter coupled to the third clock input and having a second inverter output; a first NAND gate coupled to the third clock input and the data input and having a first NAND gate output; a second NAND gate coupled to the first inverter output and the second inverter output and having a second NAND gate output; a first NOR gate coupled to the first NAND gate output and the second clock input and having a first NOR gate output; a first p-type transistor having a drain, a gate, and a source, wherein the drain of the first p-type transistor is coupled to the pulse generator output and the first gate is coupled to the second NAND gate output; and a first n-type transistor having a drain, a gate, and a source, wherein the drain of the first n-type transistor is coupled to the pulse generator output and the gate is coupled to the first NOR gate output. In such an example, each of the third and fourth pulse generators may additionally or alternatively comprise a second NOR gate coupled to the data input and the third clock input and having a second NOR gate output; a third inverter coupled to the third clock input and having a third inverter output; a fourth inverter coupled to the first clock input and having a fourth inverter output; a third NAND gate coupled to the second clock input and the second NOR gate output; a third NOR gate coupled to the third inverter output and the fourth inverter output; a second p-type transistor having a drain, a gate, and a source, wherein the drain of the second p-type transistor is coupled to the pulse generator output and the gate of the second p-type transistor is coupled to the third NAND gate output; and a second n-type transistor having a drain, a gate, and a source, wherein the drain of the second n-type transistor is coupled to the pulse generator output and the gate of the second n-type transistor is coupled to the third NOR gate output. In such an example, the first and fourth pulse generators' first clock inputs may additionally or alternatively be coupled to a first clock source; the first and fourth pulse generators' second clock inputs may additionally or alternatively be coupled to a second clock source; the first and fourth pulse generators' third clock inputs may additionally or alternatively be coupled to a third clock source; the second and third pulse generators' first clock inputs may additionally or alternatively be coupled to a fourth clock source; the second and third pulse generators' second clock inputs may additionally or alternatively be coupled to a fifth clock source; and the second and third pulse generators' third clock inputs may additionally or alternatively be coupled to a sixth clock source. In such an example, the serializing transmitter may additionally or alternatively further comprise an n-type voltage-controlled resistor having a first resistance and being coupled between ground and the source of each n-type transistor; and a p-type voltage-controlled resistor having a second resistance and being coupled between the positive power supply and the source of each p-type transistor. In such an example, the serializing transmitter may additionally or alternatively be configured to exhibit a pull-up source resistance and a pull-down source resistance, and the serializing transmitter may additionally or alternatively further comprise fourth and fifth feedback control loops configured to control said source resistances by controlling the first resistance and the second resistance. In such an example, each of the NAND gates, the AND gates, the NOR gates, and the inverters may additionally or alternatively have a positive power supply terminal coupled to the positive power supply and may additionally or alternatively have a negative power supply terminal coupled to ground. In such an example, N may additionally or alternatively equal 4; the multi-phase clock signals may additionally or alternatively comprise input clock signals 0, 1, 2, 3, 4, 5, 6, and 7 which are equally spaced in phase through 360 degrees; and the input data signals may additionally or alternatively further comprise input data signals 0, 1, 2, 3, 4, 5, 6, and 7. In such an example, for an integer n=0 to N−1, the data input of the nth multiplexing drive unit's first pulse generator may additionally or alternatively be coupled to input data signal n; the data input of the nth multiplexing drive unit's second pulse generator may additionally or alternatively be coupled to input data signal n+4; the data input of the nth multiplexing drive unit's third pulse generator may additionally or alternatively be coupled to input data signal n; and the data input of the nth multiplexing drive unit's fourth pulse generator may additionally or alternatively be coupled to the input data signal n+4. In such an example, for an integer n=0 to N−1, the first clock inputs of the nth multiplexing drive unit's first and fourth pulse generators may additionally or alternatively be coupled to input clock signal n; the second clock inputs of the nth multiplexing drive unit's first and fourth pulse generators may additionally or alternatively be coupled to input clock signal n+1; the third clock inputs of the nth multiplexing drive unit's first and fourth pulse generators may additionally or alternatively be coupled to input clock signal n+3; the first clock inputs of the nth multiplexing drive unit's second and third pulse generators may additionally or alternatively be coupled to input clock signal (n+4 modulo 2*N); the second clock inputs of the nth multiplexing drive unit's second and third pulse generators may additionally or alternatively be coupled to input clock signal (n+5 modulo 2*N); and the third clock inputs of the nth multiplexing drive unit's second and third pulse generators may additionally or alternatively be coupled to input clock signal (n+7 modulo 2*N). Any or all of the above-described examples may be combined in any suitable manner in various implementations.

Another example provides a serializing transmitter system with 2-tap pre-emphasis, comprising a first serializing transmitter as described in the prior example and a second serializing transmitter as described in the prior example, wherein the outputs of the first and second serializing transmitters are coupled together. In such an example, parallel data signals 0-7, each exhibiting data transitions, may additionally or alternatively be asserted on data inputs 0-7 of the first serializing transmitter; a complement of parallel data signals 0-6 may additionally or alternatively be asserted on respective data inputs 1-7 of the second serializing transmitter; and a complement of parallel data signal 7 may additionally or alternatively be asserted on data input 0. Any or all of the above-described examples may be combined in any suitable manner in various implementations.

Another example provides a serializing transmitter, comprising N multiplexing drive units, each configured to generate a series of output pulses derived from input data signals and multi-phase clock signals, wherein N is a positive integer, and wherein each multiplexing drive unit includes a pulse-controlled push-pull output driver having a first input, a second input, and an output coupled to an output of the multiplexing drive unit; a first M:1 pulse-generating multiplexer having an output coupled to the first input of the pulse-controlled push-pull output driver, where M is two or more; and a second M:1 pulse-generating multiplexer having an output coupled to the second input of the pulse-controlled push-pull output driver, wherein each of the first and second M:1 pulse-generating multiplexers has four or fewer gate delays from a clock input to an output of the multiplexing drive unit. In such an example, the first M:1 pulse-generating multiplexer and the second M:1 pulse-generating multiplexer may additionally or alternatively each include a first pulse generator and a second pulse generator, each of the first pulse generator and the second pulse generator having a data input, a first clock input, a second clock input, a third clock input, and an output, and wherein the outputs of the first pulse generator and the second pulse generator are coupled together. In such an example, the first pulse generator of each of the first M:1 pulse-generating multiplexer and the second M:1 pulse-generating multiplexer may additionally or alternatively be coupled to a first data signal, and the second pulse generator of each of the first M:1 pulse-generating multiplexer and the second M:1 pulse-generating multiplexer may additionally or alternatively be coupled to a second data signal. Any or all of the above-described examples may be combined in any suitable manner in various implementations.

Although embodiments of a serializing transmitter have been described in language specific to features and/or methods, the subject of the appended claims is not necessarily limited to the specific features or methods described. Rather, the specific features and methods are disclosed as example implementations of a serializing transmitter, and numerous variations are possible.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A serializing transmitter, comprising:
N multiplexing drive units, each configured to generate a series of output pulses derived from input data signals and multi-phase clock signals, wherein N is a positive integer, and wherein each multiplexing drive unit includes
 a pulse-controlled push-pull output driver having first and second inputs and an output,
 a first M:1 pulse-generating multiplexer having an output coupled to the first input of the pulse-controlled push-pull output driver and configured to generate a first series of intermediate pulses having a first pulse width at said output, where M is two or more, and
 a second M:1 pulse-generating multiplexer having an output coupled to the second input of the pulse-controlled push-pull output driver and configured to generate a second series of intermediate pulses having a second pulse width at said output,
 wherein each of the first and second M:1 pulse-generating multiplexers has three or fewer gate delays from a clock input corresponding to each of the multi-phase clock signals to an output of the respective pulse-generating multiplexer.

2. The serializing transmitter of claim 1, wherein the outputs of the multiplexing drive units are coupled together.

3. The serializing transmitter of claim 2, wherein M equals 2, and wherein the coupled outputs of the multiplexing drive units are configured to output a serial data signal having a data rate.

4. The serializing transmitter of claim 3, wherein the first 2:1 pulse-generating multiplexer includes first and second pulse generators, each having a data input, first, second, and third clock inputs, and an output, and wherein the outputs of the first and second pulse generators are coupled together.

5. The serializing transmitter of claim 4, wherein the second 2:1 pulse-generating multiplexer includes third and fourth pulse generators, each having a data input, first, second, and third clock inputs, and an output, and wherein the outputs of the third and fourth pulse generators are coupled together.

6. The serializing transmitter of claim 5, wherein the first and third pulse generators are coupled to a first data signal input, and the second and fourth pulse generators are coupled to a second data signal input.

7. The serializing transmitter of claim 6, wherein each of the first and second pulse generators comprises
 a first inverter coupled to the first clock input and having a first inverter output;
 a second inverter coupled to the third clock input and having a second inverter output;
 a first NAND gate coupled to the third clock input and the data input and having a first NAND gate output;
 a second NAND gate coupled to the first inverter output and the second inverter output and having a second NAND gate output;
 a first NOR gate coupled to the first NAND gate output and the second clock input and having a first NOR gate output;
 a first p-type transistor having a drain, a gate, and a source, wherein the drain of the first p-type transistor is coupled to the pulse generator output and the first gate is coupled to the second NAND gate output; and
 a first n-type transistor having a drain, a gate, and a source, wherein the drain of the first n-type transistor is coupled to the pulse generator output and the gate is coupled to the first NOR gate output.

8. The serializing transmitter of claim 7, wherein each of the third and fourth pulse generators comprises
 a second NOR gate coupled to the data input and the third clock input and having a second NOR gate output;
 a third inverter coupled to the third clock input and having a third inverter output;
 a fourth inverter coupled to the first clock input and having a fourth inverter output;
 a third NAND gate coupled to the second clock input and the second NOR gate output;
 a third NOR gate coupled to the third inverter output and the fourth inverter output;
 a second p-type transistor having a drain, a gate, and a source, wherein the drain of the second p-type transistor is coupled to the pulse generator output and the gate of the second p-type transistor is coupled to the third NAND gate output; and
 a second n-type transistor having a drain, a gate, and a source, wherein the drain of the second n-type transistor is coupled to the pulse generator output and the gate of the second n-type transistor is coupled to the third NOR gate output.

9. The serializing transmitter of claim 8 wherein
 the first and fourth pulse generators' first clock inputs are coupled to a first clock source;
 the first and fourth pulse generators' second clock inputs are coupled to a second clock source;
 the first and fourth pulse generators' third clock inputs are coupled to a third clock source;
 the second and third pulse generators' first clock inputs are coupled to a fourth clock source;
 the second and third pulse generators' second clock inputs are coupled to a fifth clock source; and
 the second and third pulse generators' third clock inputs are coupled to a sixth clock source.

10. The serializing transmitter of claim 8, further comprising
 an n-type voltage-controlled resistor having a first resistance and being coupled between ground and the source of each n-type transistor; and
 a p-type voltage-controlled resistor having a second resistance and being coupled between the positive power supply and the source of each p-type transistor.

11. The serializing transmitter of claim 10, wherein the serializing transmitter is configured to exhibit a pull-up source resistance and a pull-down source resistance, and wherein the serializing transmitter further comprising fourth and fifth feedback control loops configured to control said source resistances by controlling the first resistance and the second resistance.

12. The serializing transmitter of claim 11, wherein each of the NAND gates, the AND gates, the NOR gates, and the inverters have a positive power supply terminal coupled to the positive power supply and have a negative power supply terminal coupled to ground.

13. The serializing transmitter of claim 8, wherein,
 N equals 4;
 the multi-phase clock signals comprise input clock signals 0, 1, 2, 3, 4, 5, 6, and 7 which are equally spaced in phase through 360 degrees; and
 the input data signals further comprise input data signals 0, 1, 2, 3, 4, 5, 6, and 7.

14. The serializing transmitter of claim 13, wherein for an integer n=0 to N−1, the data input of the nth multiplexing drive unit's first pulse generator is coupled to input data signal n;

the data input of the nth multiplexing drive unit's second pulse generator is coupled to input data signal n+4;

the data input of the nth multiplexing drive unit's third pulse generator is coupled to input data signal n; and the data input of the nth multiplexing drive unit's fourth pulse generator is coupled to the input data signal n+4.

15. The serializing transmitter of claim 14, wherein for an integer n=0 to N−1, the first clock inputs of the nth multiplexing drive unit's first and fourth pulse generators are coupled to input clock signal n;

the second clock inputs of the nth multiplexing drive unit's first and fourth pulse generators are coupled to input clock signal n+1;

the third clock inputs of the nth multiplexing drive unit's first and fourth pulse generators are coupled to input clock signal n+3;

the first clock inputs of the nth multiplexing drive unit's second and third pulse generators are coupled to input clock signal (n+4 modulo 2*N);

the second clock inputs of the nth multiplexing drive unit's second and third pulse generators are coupled to input clock signal (n+5 modulo 2*N); and the third clock inputs of the nth multiplexing drive unit's second and third pulse generators are coupled to input clock signal (n+7 modulo 2*N).

16. A serializing transmitter system with 2-tap pre-emphasis, comprising a first serializing transmitter of claim 15 and a second serializing transmitter of claim 15, wherein the outputs of the first and second serializing transmitters are coupled together.

17. The serializing transmitter with 2-tap pre-emphasis of claim 16, wherein parallel data signals 0-7, each exhibiting data transitions, are asserted on data inputs 0-7 of the first serializing transmitter;

a complement of parallel data signals 0-6 are asserted on respective data inputs 1-7 of the second serializing transmitter; and a complement of parallel data signal 7 is asserted on data input 0.

18. A serializing transmitter, comprising:

N multiplexing drive units, each configured to generate a series of output pulses derived from input data signals and multi-phase clock signals, wherein N is a positive integer, and wherein each multiplexing drive unit includes a pulse-controlled push-pull output driver having a first input, a second input, and an output coupled to an output of the multiplexing drive unit;

a first M:1 pulse-generating multiplexer having an output coupled to the first input of the pulse-controlled push-pull output driver, where M is two or more; and a second M:1 pulse-generating multiplexer having an output coupled to the second input of the pulse-controlled push-pull output driver, wherein each of the first and second M:1 pulse-generating multiplexers has four or fewer gate delays from a clock input corresponding to each of the multi-phase clock signals to an output of the respective multiplexing drive unit.

19. The serializing transmitter of claim 18, wherein the first M:1 pulse-generating multiplexer and the second M:1 pulse-generating multiplexer each include a first pulse generator and a second pulse generator, each of the first pulse generator and the second pulse generator having a data input, a first clock input, a second clock input, a third clock input, and an output, and wherein the outputs of the first pulse generator and the second pulse generator are coupled together.

20. The serializing transmitter of claim 19, wherein the first pulse generator of each of the first M:1 pulse-generating multiplexer and the second M:1 pulse-generating multiplexer is coupled to a first data signal, and the second pulse generator of each of the first M:1 pulse-generating multiplexer and the second M:1 pulse-generating multiplexer is coupled to a second data signal.

* * * * *